United States Patent
Shih

(10) Patent No.: US 7,038,965 B2
(45) Date of Patent: May 2, 2006

(54) POINTER GENERATOR FOR STACK

(75) Inventor: Ying-Heng Shih, Pingtung (TW)

(73) Assignee: Benq Corporation, Taoyuan (TW)

( * ) Notice: Subject to any disclaimer, the term of this patent is extended or adjusted under 35 U.S.C. 154(b) by 196 days.

(21) Appl. No.: 10/736,573

(22) Filed: Dec. 17, 2003

(65) Prior Publication Data
US 2004/0125685 A1    Jul. 1, 2004

(30) Foreign Application Priority Data
Dec. 20, 2002    (TW)    ............................ 91136923 A

(51) Int. Cl.
    *G11C 7/00*    (2006.01)
(52) U.S. Cl. .................... 365/221; 365/78; 365/189.12
(58) Field of Classification Search ............... 365/78 X, 365/221 O, 189.12 X
    See application file for complete search history.

(56) References Cited

U.S. PATENT DOCUMENTS

| | | | | |
|---|---|---|---|---|
| 4,751,675 A | * | 6/1988 | Knauer | ......................... 365/78 |
| 4,807,185 A | | 2/1989 | Kamiya | ....................... 364/900 |
| 4,899,307 A | | 2/1990 | Lenoski | ....................... 365/78 |
| 6,345,353 B1 | | 2/2002 | Allen et al. | ................... 712/202 |

* cited by examiner

*Primary Examiner*—VanThu Nguyen
(74) *Attorney, Agent, or Firm*—Michael Bednarek; Pillsbury Winthrop Shaw Pittman LLP

(57) ABSTRACT

The present invention discloses a pointer generator which generates pointer values for a stack (LIFO memory). The pointer generator includes a selection input terminal and a bi-direction linear feedback shift register. The selection input terminal transmits a selection signal to the bi-direction linear feedback shift register in response to a command to read/write the stack. The fundamental structure of the bi-direction linear feedback shift register is a linear feedback shift register. After receiving the selection signal from the selection input terminal, the bi-direction linear feedback shift register performs calculation of a specific primitive characteristic polynomial, and then creates a number sequence. When the selection signal changes, the bi-direction linear feedback shift register creates another number sequence by performing calculation of another specific primitive characteristic polynomial. The two number sequences are exactly opposite to each other in order. Therefore, one sequence can be used as up-counting stack pointer values for the "write" command, and the other sequence can be used as down-counting stack pointer values for "read" command.

20 Claims, 5 Drawing Sheets

POINTER GENERATOR FOR STACK

This Application claims priority to Taiwan Patent Application No. 091136923 filed on Dec. 20, 2002.

FIELD OF INVENTION

The present invention relates to a pointer generator and a method for generating pointer values, which point to a stack or a last-in-first-out memory (LIFO memory).

BACKGROUND OF THE INVENTION

For the general VLSI design, a LIFO memory, or a stack, is a common part of an IC for particular purposes. This kind of memory needs a pointer generator to generate pointer values pointing to a certain address of the memory while reading or writing data.

Pointer generators of the prior art adopt up-down counters. When data is written into the stack, 1 is added to the pointer value, which points to a next address. When data is read from the stack, 1 is subtracted from the pointer value, which points to a previous address. However, the up-down counters have defects—huge layout area and low operating frequency, and, hence, are not suitable for small and speedy electronic devices.

SUMMARY OF THE INVENTION

The present invention provides a pointer generator for generating pointer values pointing to a stack. The generator includes a selection input terminal and a bi-direction linear feedback shift register. The selection input terminal is configured to input a selection signal in response to a command accessing the stack. The bi-direction linear feedback shift register, a linear feedback shift register basically, can generate a first number sequence as the pointer values by performing calculation of a first primitive characteristic polynomial after receiving the selection signal. Once the selection signal is changed, the bi-direction linear feedback shift register still executes function of linear feedback shift register, but a second primitive characteristic polynomial is calculated now to generate a second number sequence whose order is opposite to that of the first number sequence. Therefore, the first number sequence can be used as up-counting pointer values for data writing and the second number sequence can be used as down-counting pointer values for data reading.

The present invention replaces up-down counters of the prior art with linear feedback shift registers to save layout area, increase operating frequency and, moreover, reinforce security.

DETAILED DESCRIPTION

The present invention discloses a pointer generator, having a linear feedback shift register, to generate pointer values pointing to a stack. The generator includes a selection input terminal and a bi-direction linear feedback shift register. The selection input terminal inputs a selection signal in response to a command accessing the stack. The bi-direction linear feedback shift register performs calculation of a primitive characteristic polynomial and, in response to the selection signal, selects one of up-counting and down-counting orders during calculation to generate the pointer values. The orders herein do not mean adding or subtracting by 1 in turn but mean particular orders generated by calculation of the primitive characteristic polynomial.

Figure 1:
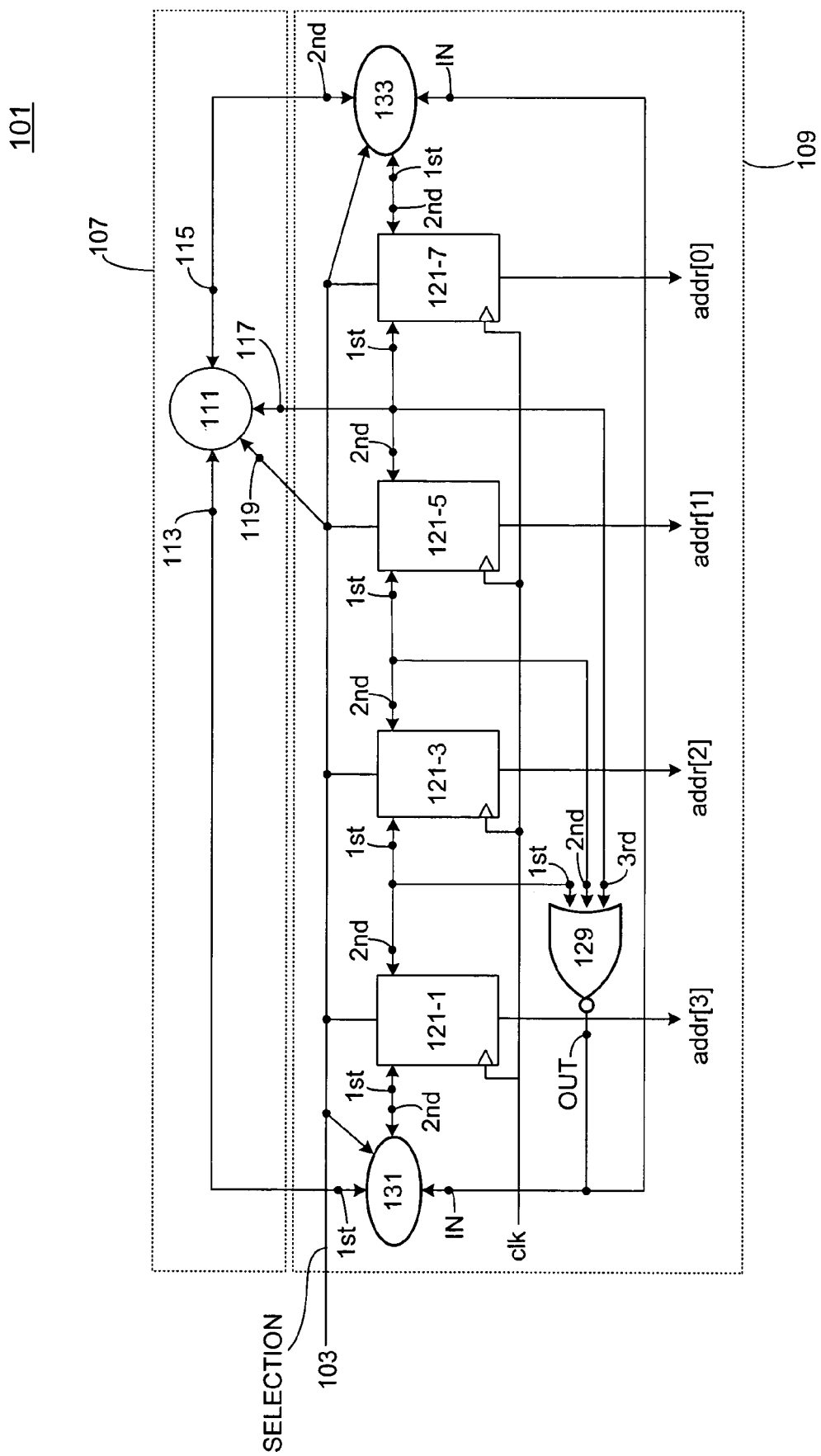
FIG. 1 illustrates the circuitry of the pointer generator of the present invention.

FIG. 1 shows an embodiment of the present invention. The generator 101 includes a selection input terminal 103 and a bi-direction linear feedback shift register. The bi-direction linear feedback shift register includes a bi-direction circuit 107 and a bi-direction number sequence generation circuit 109. The bi-direction circuit 107 is configured to perform calculation of a specific primitive characteristic polynomial, which is $X^4+X^3+1$ or $X^4+X+1$ in this embodiment. The bi-direction number sequence generation circuit 109 is configured to generate pointer values addr[0]~addr[3] pointing to the stack in response to the selection signal SELECTION and calculation of the primitive characteristic polynomial.

The bi-direction circuit 107 is usually made of logic gates to perform calculation of a primitive characteristic polynomial. In the embodiment, the bi-direction circuit 107 includes a bi-direction XOR gate 111, a first I/O terminal 113, a second I/O terminal 115, a data input terminal 117 and a selection input terminal 119. The bi-direction circuit 107 can switch to a first state or a second state in response to the selection signal SELECTION inputted from the selection input terminal 119. For example, when the bi-direction circuit 107 is in the first state, the first I/O terminal 113 executes input function and the second I/O terminal 115 executes output function; when the bi-direction circuit 107 is in the second state, the first I/O terminal 113 executes output function and the second I/O terminal 115 executes input function.

Figure 2:
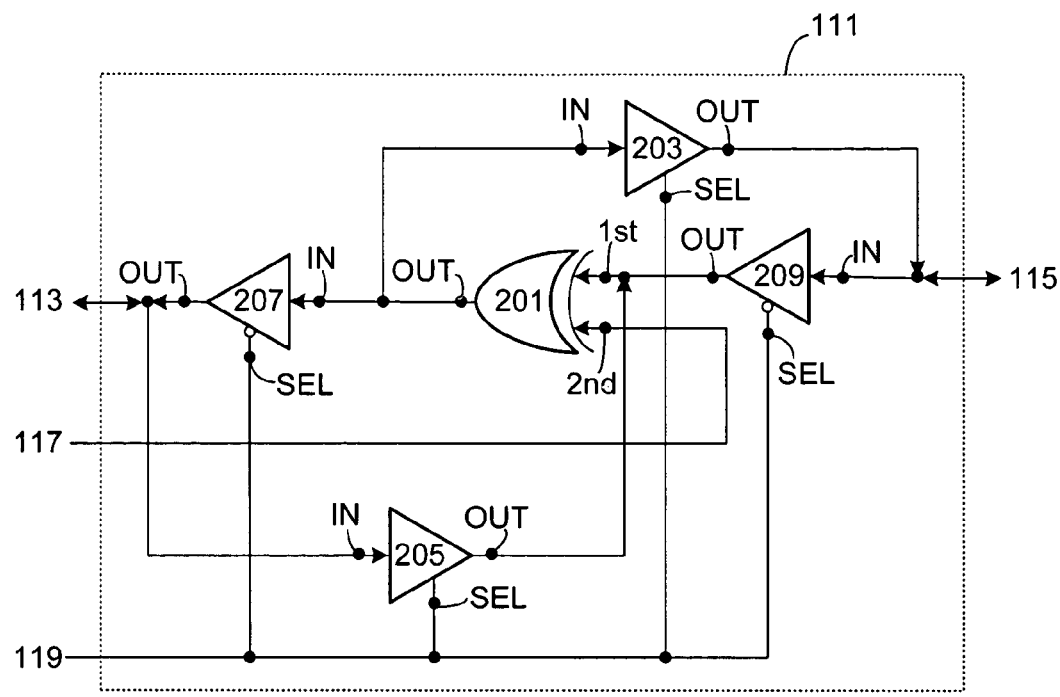
FIG. 2 illustrates the circuitry of the bi-direction XOR gate.

FIG. 2 shows the circuitry of the bi-direction XOR gate 111 displayed in FIG. 1. The bi-direction XOR gate 111 includes an XOR gate 201, a first buffer 203, a second buffer 205, a third buffer 207 and a fourth buffer 209. The XOR gate 201 includes an output terminal OUT, a first input terminal 1st and a second input terminal 2nd. The buffers 203, 205, 207, 209 respectively include an output terminal OUT, an input terminal IN and a selection input terminal SEL. The first input terminal 1st of the XOR gate 201 is connected to the output terminals OUT of the second buffer 205 and of the fourth buffer 209. The second input terminal 2nd of the XOR gate 201 is the data input terminal 117 of the bi-direction circuit 107. The output terminal OUT of the XOR gate 201 is connected to the input terminals IN of the first buffer 203 and of the third buffer 207. The output terminal OUT of the first buffer 203 is connected to the input terminal IN of the fourth buffer 209 and the second I/O terminal 115 of the bi-direction circuit 107. The input terminal IN of the second buffer 205 is connected to the output terminal OUT of the third buffer 207 and the first I/O terminal 113 of the bi-direction circuit 107. The selection input terminals SEL of the buffers 203, 205, 207, 209 are altogether connected to the selection input terminal 119 of the bi-direction circuit 107. The selection input terminal 119 of the bi-direction circuit 107 is connected to the selection input terminal 103 of the generator 101.

The selection input terminals SEL of the buffers 203, 205, 207, 209 are enable terminals. As shown in FIG. 2, the first buffer 203 and the second buffer 205 are high-level enable buffers, and the third buffer 207 and the fourth buffer 209 are low-level enable buffers. When a high-level signal is inputted into the selection input terminal 119 of the bi-direction circuit 107, the first buffer 203 and the second buffer 205 are turned on, and the third buffer 207 and the fourth buffer 209 are turned off. Hence, a current flows through the first I/O terminal 113 of the bi-direction circuit 107, the second buffer 205, the XOR gate 201, the first buffer 203 and finally outputs to the second I/O terminal 115 of the bi-direction circuit 107. When a low-level signal is inputted into the selection input terminal 119 of the bi-direction circuit 107, the first buffer 203 and the second buffer 205 are turned off, and the third buffer 207 and the fourth buffer 209 are turned on. Hence, a current flows through the second I/O terminal 115 of the bi-direction circuit 107, the fourth buffer 209, the XOR gate 201, the third buffer 207 and finally outputs to the first I/O terminal 113 of the bi-direction circuit 107. In other words, the direction of signal transmission of the bi-direction XOR gate 111 depends on the level of the selection signal SELECTION.

The bi-direction number sequence generation circuit 109 is configured to generate pointer values addr[0]~addr[3] to point to the stack. As shown in FIG. 1, the bi-direction number sequence generation circuit 109 of the embodiment includes four bi-direction registers 121-1, 121-3, 121-5, 121-7 connected in series, a NOR gate 129, a first bi-function circuit 131 and a second bi-function circuit 133. Each bi-direction register 121, including a first I/O terminal 1st and a second I/O terminal 2nd, selectively switches to either the first state or the second state to execute register function in response to the selection signal SELECTION. The NOR gate 129 includes an output terminal OUT and three input terminals 1st, 2nd, 3rd. The first bi-function circuit 131 and the second bi-function circuit 133, respectively including a first I/O terminal 1st, a second I/O terminal 2nd and an input terminal IN, selectively switch to either the first state or the second state to execute XOR gate function or buffer function in response to the selection signal SELECTION. The second I/O terminals 2nd of the bi-direction registers 121-1, 121-3, 121-5 are respectively connected to the input terminals 1st, 2nd, 3rd of the NOR gate 129. The output terminal OUT of the NOR gate 129 is connected to the input terminals IN of the first bi-function circuit 131 and the second bi-function circuit 133. The second I/O terminal 2nd of the first bi-function circuit 131 is connected to the first I/O terminal 1st of the first bi-direction register 121-1. The second I/O terminal 2nd of the fourth bi-direction register 121-7 is connected to the first I/O terminal 1st of the second bi-function circuit 133.

When the bi-direction number sequence generation circuit 109 is in the first state, the second I/O terminals 2nd of the bi-direction registers 121, the second I/O terminal 2nd of the first bi-function circuit 131 and the second I/O terminal 2nd of the second bi-function circuit 133 respectively execute input function, and the first I/O terminals 1st of the bi-direction registers 121, the first I/O terminal 1st of the first bi-function circuit 131 and the first I/O terminal 1st of the second bi-function circuit 133 respectively execute output function. When the bi-direction number sequence generation circuit 109 is in the second state, the first I/O terminals 1st of the bi-direction registers 121, the first I/O terminal 1st of the first bi-function circuit 131 and the first I/O terminal 1st of the second bi-function circuit 133 respectively execute input function, and the second I/O terminals 2nd of the bi-direction registers 121, the second I/O terminal 2nd of the first bi-function circuit 131 and the second I/O terminal 2nd of the second bi-function circuit 133 respectively execute output function.

The first I/O terminal 1st of the first bi-function circuit 131 is connected to the first I/O terminal 113 of the bi-direction circuit 107, as shown in FIG. 1. The second I/O terminal 2nd of the second bi-function circuit 133 is connected to the second I/O terminal 115 of the bi-direction circuit 107. In the embodiment, the bi-direction circuit 107 performs calculation of a first primitive characteristic polynomial, $X^4+X^3+1$, in the first state and performs calculation of a second primitive characteristic polynomial, $X^4+X+1$, in the second state. These two primitive characteristic polynomials are complementary to each other, i.e. the order of the number sequence generated by the first primitive characteristic polynomial is exactly opposite to the order of the number sequence generated by the second primitive characteristic polynomial for the purposes of up-counting and down-counting. To accomplish the first and second primitive characteristic polynomials, the second I/O terminal 2nd of the third bi-direction register 121-5 is connected to the data input terminal 117 of the bi-direction circuit 107.

Figure 3:
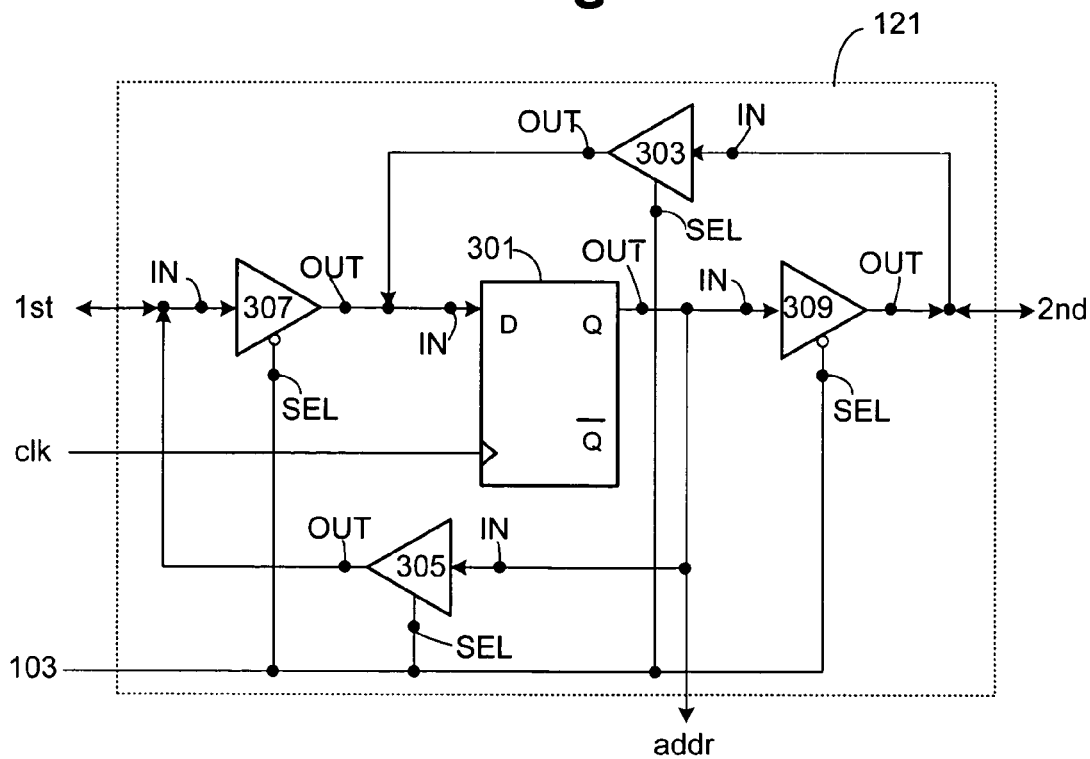
FIG. 3 illustrates the circuitry of the bi-direction register.

FIG. 3 shows the circuitry of the bi-direction register 121 in FIG. 1. The bi-direction register 121 includes a register 301, a first buffer 303, a second buffer 305, a third buffer 307 and a fourth buffer 309. The register 301 includes an input terminal IN and an output terminal OUT. The buffers 303, 305, 307, 309 respectively include an input terminal IN, an output terminal OUT and a selection input terminal SEL. The input terminal IN of the register 301 is connected to the output terminals OUT of the first buffer 303 and the third buffer 307. The output terminal OUT of the register 301 is connected to the input terminals IN of the second buffer 305 and the fourth buffer 309. The input terminal IN of the first buffer 303 is connected to the output terminal OUT of the fourth buffer 309 and the second I/O terminal 2nd of the bi-direction register 121. The input terminal IN of the third buffer 307 is connected to the output terminal OUT of the second buffer 305 and the first I/O terminal 1st of the bi-direction register 121. The selection input terminals SEL of the buffers 303, 305, 307, 309 are connected to the selection input terminal 103 of the generator 101.

The selection input terminals SEL of the buffers 303, 305, 307, 309 are enable terminals. As shown in FIG. 3, the first buffer 303 and the second buffer 305 are high-level enable buffers, and the third buffer 307 and the fourth buffer 309 are low-level enable buffers. When the selection signal SELECTION is high, the first buffer 303 and the second buffer 305 are turned on, and the third buffer 307 and the fourth buffer 309 are turned off. Hence, a current flows through the second I/O terminal 2nd of the bi-direction register 121, the first buffer 303, the register 301, the second buffer 305 and finally outputs to the first I/O terminal 1st of the bi-direction register 121. When the selection signal SELECTION is low, the first buffer 303 and the second buffer 305 are turned off, and the third buffer 307 and the fourth buffer 309 are turned on. Hence, a current flows through the first I/O terminal 1st of the bi-direction register 121, the third buffer 307, the register 301, the fourth buffer 309 and finally outputs to the second I/O terminal 2nd of the bi-direction register 121.

In the embodiment, the register 301 is, but not limited to, a D type flip-flop.

Figure 4:
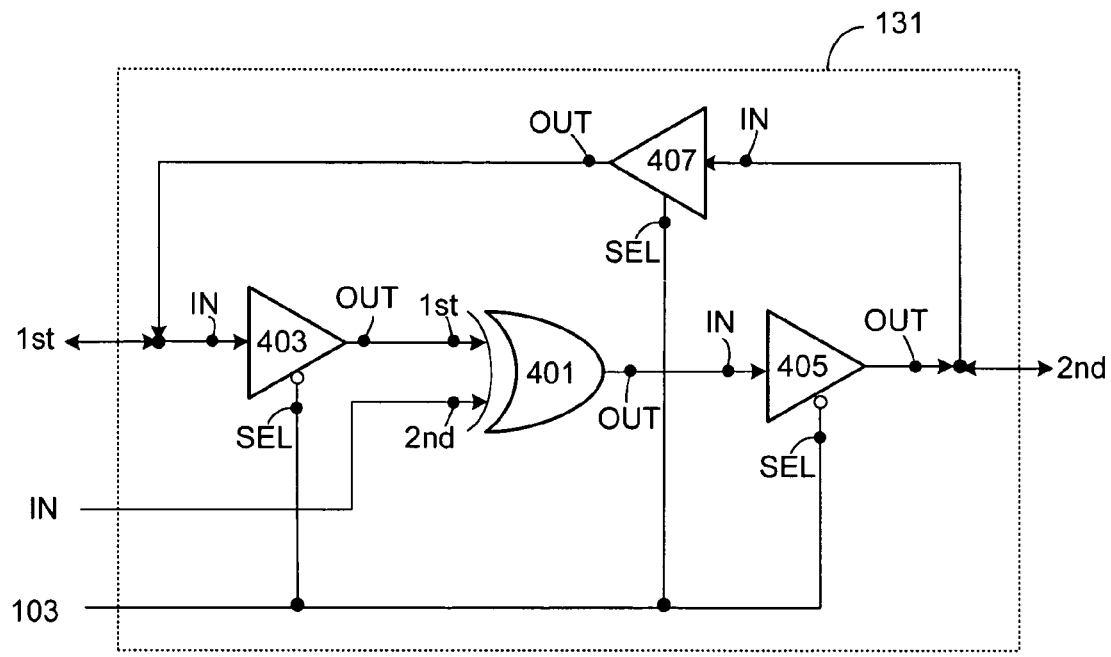
FIG. 4 illustrates the circuitry of the first bi-function circuit.

FIG. 4 shows the circuitry of the first bi-function circuit 131 displayed in FIG. 1. The first bi-function circuit 131 includes an XOR gate 401, a first buffer 403, a second buffer 405 and a third buffer 407. The XOR gate 401 includes an output terminal OUT, a first input terminal 1st and a second input terminal 2nd. The buffers 403, 405, 407 respectively include an input terminal IN, an output terminal OUT and a selection input terminal SEL. The output terminal OUT of the XOR gate 401 is connected to the input terminal IN of the second buffer 405. The first input terminal 1st of the XOR gate 401 is connected to the output terminal OUT of the first buffer 403. The second input terminal 2nd of the XOR gate 401 is the input terminal IN of the first bi-function circuit 131. The output terminal OUT of the third buffer 407 is connected to the input terminal IN of the first buffer 403 and the first I/O terminal 1st of the first bi-function circuit 131. The input terminal IN of the third buffer 407 is connected to the output terminal OUT of the second buffer 405 and the second I/O terminal 2nd of the first bi-function circuit 131. The selection input terminals SEL of the buffers 403, 405, 407 are connected to the selection input terminal 103 of the generator 101.

The selection input terminals SEL of the buffers 403, 405, 407 are enable terminals. As shown in FIG. 4, the first buffer 403 and the second buffer 405 are low-level enable buffers, and the third buffer 407 is a high-level enable buffer. When the selection signal SELECTION is high, the first buffer 403 and the second buffer 405 are turned off, and the third buffer 407 is turned on. Hence, a current flows through the second I/O terminal 2nd of the first bi-function circuit 131, the third buffer 407 and finally outputs to the first I/O terminal 1st of the first bi-function circuit 131 to execute buffer function. When the selection signal SELECTION is low, the first buffer 403 and the second buffer 405 are turned on, and the third buffer 407 is turned off. Hence, a current flows through the first I/O terminal 1st of the first bi-function circuit 131, the XOR gate 401, the second buffer 405 and finally outputs to the second I/O terminal 2nd of the first bi-function circuit 131 to execute XOR gate function.

Figure 5:
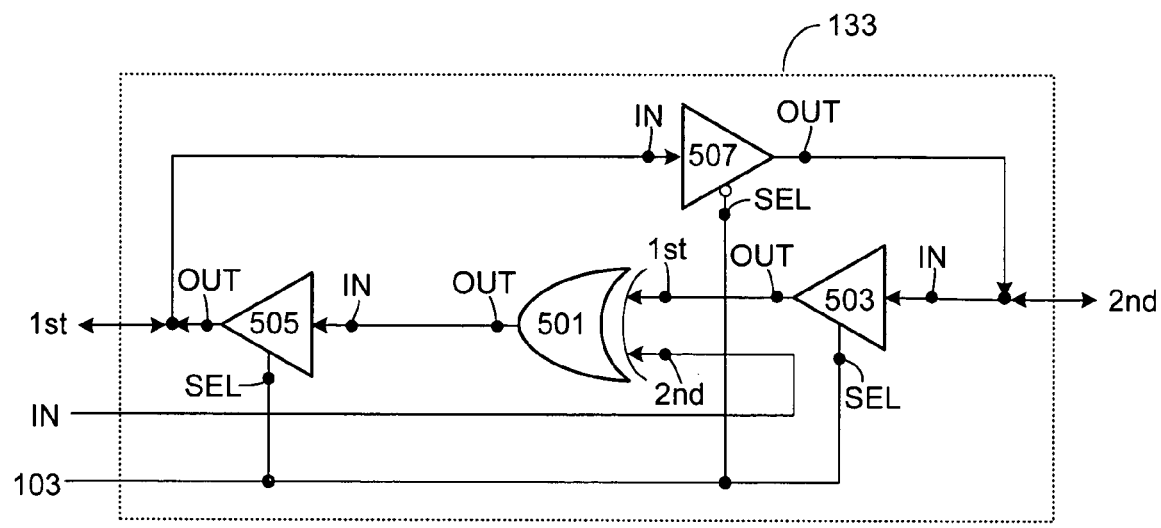
FIG. 5 illustrates the circuitry of the second bi-function circuit.

FIG. 5 shows the circuitry of the second bi-function circuit 133 in FIG. 1. The second bi-function circuit 133 includes an XOR gate 501, a first buffer 503, a second buffer 505 and a third buffer 507. The XOR gate 501 includes an output terminal OUT, a first input terminal 1st and a second input terminal 2nd. The buffers 503, 505, 507 respectively include an input terminal IN, an output terminal OUT and a selection input terminal SEL. The output terminal OUT of the XOR gate 501 is connected to the input terminal IN of the second buffer 505. The first input terminal 1st of the XOR gate 501 is connected to the output terminal OUT of the first buffer 503. The second input terminal 2nd of the XOR gate 501 is connected to the input terminal IN of the second bi-function circuit 133. The output terminal OUT of the third buffer 507 is connected to the input terminal IN of the first buffer 503 and the second I/O terminal 2nd of the second bi-function circuit 133. The input terminal IN of the third buffer 507 is connected to the output terminal OUT of the second buffer 505 and the first I/O terminal 1st of the second bi-function circuit 133. The selection input terminals SEL of the buffers 503, 505, 507 are connected to the selection input terminal 103 of the generator 101.

The selection input terminals SEL of the buffers 503, 505, 507 are enable terminals. As shown in FIG. 5, the first buffer 503 and the second buffer 505 are high-level enable buffers, and the third buffer 507 is a low-level enable buffer. When the selection signal SELECTION is high, the first buffer 503 and the second buffer 505 are turned on, and the third buffer 507 is turned off. Hence, a current flows through the second I/O terminal 2nd of the second bi-function circuit 133, the first buffer 503, the XOR gate 501, the second buffer 505 and finally outputs to the first I/O terminal 1st of the second bi-function circuit 133 to execute XOR gate function. When the selection signal SELECTION is low, the first buffer 503 and the second buffer 505 are turned off, and the third buffer 507 is turned on. Hence, a current flows through the first I/O terminal 1st of the second bi-function circuit 133, the third buffer 507 and finally outputs to the second I/O terminal 2nd of the second bi-function circuit 133 to execute buffer function.

Figure 6A:
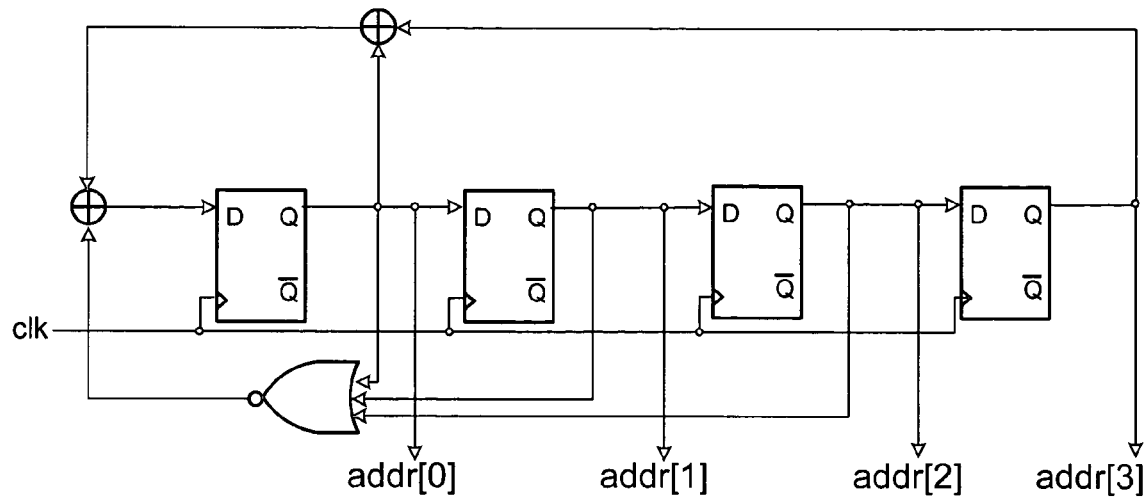
FIG. 6(a) illustrates the circuitry of the pointer generator in the first state.
Figure 6B:
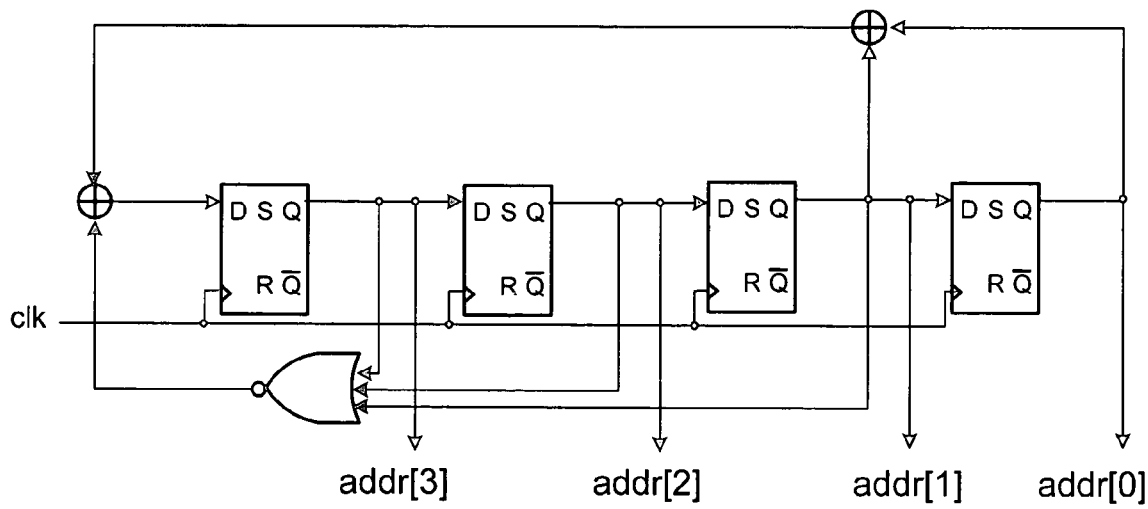
FIG. 6(b) illustrates the circuitry of the pointer generator in the second state.

In the embodiment, the first state corresponds to the state when the selection signal is high. The generator 101 in the first state can be simplified as shown in FIG. 6(a). This circuitry is a linear feedback shift register which can perform the first primitive characteristic polynomial, $X^4+X^3+1$, to generate the first number sequence as pointer values pointing to the stack. The second state corresponds to the state when the selection signal is low. The generator 101 in the second state can be simplified as shown in FIG. 6(b). This circuitry is also a linear feedback shift register which can perform the second primitive characteristic polynomial, $X^4+X+1$, to generate the second number sequence as pointer values pointing to the stack. It is noted that the first primitive characteristic polynomial and the second primitive characteristic polynomial are complementary to each other so that the order of the pointer values generated by the first primitive characteristic polynomial is opposite to that of the pointer values generated by the second primitive characteristic polynomial. Therefore, users can define one as up-counting pointer values for data writing and define the other as down-counting pointer values for data reading.

Figure 7:
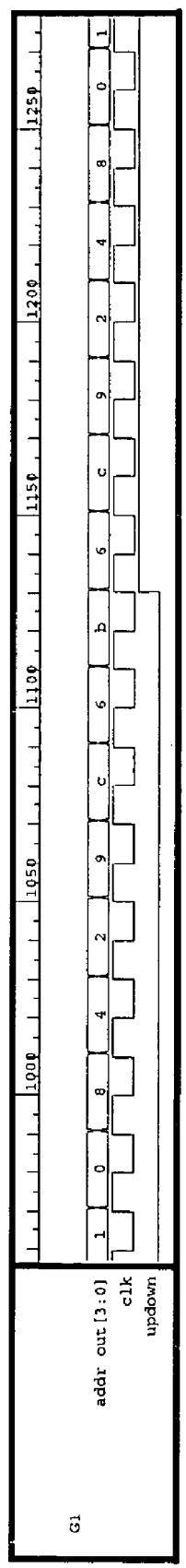
FIG. 7 illustrates the outcome of the embodiment simulated by a computer.

FIG. 7 shows the outcome of the embodiment simulated by a computer. The signal updown in FIG. 7 is the selection signal SELECTION in FIG. 1. The signal clk in FIG. 7, the same as signals clk in other figures, is a clock control signal. The signals addr out [3:0] in FIG. 7 are the same as the pointer values addr[0]~addr[3] in FIG. 1, FIG. 6(a) and FIG. 6(b). They all are 4-bit output signals capable of generating 16 levels, i.e. capable of pointing to 16 addresses, designated as {0,1,2,3,4,5,6,7,8,9, a,b,c,d,e,f}. As shown in FIG. 7, when the signal updown keeps low for a period of time (data is written into the stack), the pointer values addr out[3:0] count up as 1→0→8→4→2→9→c→6→b. when the signal updown switches from low to high (data is read from the stack), the pointer values addr out [3:0] count down as 6→c→9→2→4→8→0→1. The orders of up-counting and down-counting are exactly opposite to each other so that they can be used to point to the stack.

The present invention does not limit to use only four bi-direction registers 121, whose number should depend on the actual need. For example, if $2^N$ pointer values are desired, then N bi-direction registers in series are required. Besides, the number of the bi-direction XOR gate 111 and the number of the second I/O terminals 2nd of the bi-direction registers 121 connected to the data input terminal 117 of the bi-direction circuit 107 are also flexible. They depend on which primitive characteristic polynomial is performed.

The present invention utilizes a linear feedback shift register to implement a pointer generator. The required elements are less than pointer generators of the prior art so that the layout area of the pointer generator of the present invention is saved and, therefore, manufacture cost is decreased. The linear feedback shift register is also suitable for operating in high frequency environment because of its simple structure. Moreover, since the number order of the pointer values generated by the generator of the present invention is not successive and different primitive characteristic polynomials derive different number sequences, related data may not be stored in adjacent addresses. Therefore, security is reinforced.

Based on the aforementioned descriptions, the present invention also provides a method for generating pointer values. The method includes steps of selecting either a first state or a second state, and generating the pointer values. Particularly, the first state corresponds to the pointer values generated while selecting an Lip-counting order during calculation of the first primitive characteristic polynomial. The second state corresponds to the pointer values generated while selecting a down-counting order during calculation of the second primitive characteristic polynomial. As mentioned above, the first primitive characteristic polynomial, $X^4+X^3+1$, and the second primitive characteristic polynomial, $X^4+X+1$, are complementary to each other. When data is written into the stack, the first state is selected. When data is read from the stack, the second state is selected.

The above description of the preferred embodiments is expected to clearly expound the characteristics of the present invention but not expected to restrict the scope of the present invention. Those skilled in the art will readily observe that numerous modifications and alterations of the apparatus may be made while retaining the teaching of the invention. Accordingly, the above disclosure should be construed as limited only by the bounds of the claims.

The invention claimed is:

1. A generator for generating pointer values pointing to a stack, comprising:
 a selection input terminal for inputting a selection signal responsive to a command accessing the stack; and
 a bi-direction linear feedback shift register for selectively switching to a first state for up-coming orders and a second state for down-counting orders in response to the selection signal during calculation of primitive characteristic polynomials to generate the pointer values.

2. The generator of claim 1, wherein the bi-direction linear feedback shift register comprises:
 a bi-direction circuit, comprising a bi-direction XOR gate, for performing calculation of the primitive characteristic polynomials; and
 a bi-direction number sequence generation circuit for generating the pointer values in response to the selection signal and calculation of the primitive characteristic polynomials.

3. The generator of claim 2, the bi-direction circuit comprising a first I/O terminal, a second I/O terminal, a data input terminal and a selection input terminal,
 wherein when the bi-direction linear feedback shift register is in the first state, the first I/O terminal executes input function and the second I/O terminal executes output function; and
 wherein when the bi-direction linear feedback shift register is in the second state, the first I/O terminal executes output function and the second I/O terminal executes input function.

4. The generator of claim 3, wherein the bi-direction circuit is a bi-direction XOR gate, comprising:
 an XOR gate comprising an output terminal, a first input terminal and a second input terminal;
 a first buffer comprising an output terminal, an input terminal and a selection input terminal;
 a second buffer comprising an output terminal, an input terminal and a selection input terminal;
 a third buffer comprising an output terminal, an input terminal and a selection input terminal; and
 a fourth buffer comprising an output terminal, an input terminal and a selection input terminal;
 wherein, the first input terminal of the XOR gate is connected to the output terminals of the second buffer and the fourth buffer, the second input terminal of the XOR gate is the data input terminal of the bi-direction circuit, the output terminal of the XOR gate is connected to the input terminals of the first buffer and the third buffer, the output terminal of the first buffer is connected to the input terminal of the fourth buffer and the second I/O terminal of the bi-direction circuit, the input terminal of the second buffer is connected to the output terminal of the third buffer and the first I/O terminal of the bi-direction circuit, the selection input terminals of the first, second, third and fourth buffers are together connected to the selection input terminal of the bi-direction circuit, and, the selection input terminal of the bi-direction circuit is connected to the selection input terminal of the generator.

5. The generator of claim 3, wherein the bi-direction number sequence generation circuit comprises:
 a plurality of bi-direction registers connected together in series, each bi-direction register, comprising a first I/O terminal and a second I/O terminal, selectively switching to one of the first state and the second state to execute register function in response to the selection signal;
 a NOR gate comprising an output terminal and a plurality of input terminals;
 a first bi-function circuit, comprising a first I/O terminal, a second I/O terminal and an input terminal, selectively switching to one of the first state and the second state to execute XOR gate function and a buffer function in response to the selection signal; and
 a second bi-function circuit, comprising a first I/O terminal, a second I/O terminal and an input terminal, selectively switching to one of the first state and the second state to execute buffer and XOR gate function in response to the selection signal;
 wherein, the second I/O terminals of the plurality of bi-direction registers are selectively connected to the input terminals of the NOR gate, the output terminal of the NOR gate is connected to the input terminals of the first bi-function circuit and the second bi-function circuit, the first I/O terminal of the first bi-function circuit is connected to the first I/O terminal of the bi-direction circuit, the second I/O terminal of the first bi-function circuit is connected to the first I/O terminal of the first bi-direction register, the second I/O terminal of the last bi-direction register is connected to the first I/O terminal of the second bi-function circuit, the second I/O terminal of the second bi-function circuit is connected to the second I/O terminal of the bi-direction circuit, and, at least one of the second I/O terminals of the bi-direction registers, responsive to the primitive characteristic polynomial, is connected to the data input terminal of the bi-direction circuit;

wherein when the bi-direction number sequence generation circuit is in the first state, the second I/O terminals of the plurality of the bi-direction registers, the second I/O terminal of the first bi-function circuit and the second I/O terminal of the second bi-function circuit respectively execute input function, and the first I/O terminals of the plurality of the bi-direction registers, the first I/O terminal of the first bi-function circuit and the first I/O terminal of the second bi-function circuit respectively execute output function;

wherein when the bi-direction number sequence generation circuit is in the second state, the first I/O terminals of the plurality of the bi-direction registers, the first I/O terminal of the first bi-function circuit and the first I/O terminal of the second bi-function circuit respectively execute input function, and the second I/O terminals of the plurality of the bi-direction registers, the second I/O terminal of the first bi-function circuit and the second I/O terminal of the second bi-function circuit respectively execute output function.

6. The generator of claim 5, wherein each of the plurality of bi-direction registers comprises:
a register comprising an input terminal and an output terminal;
a first buffer comprising an input terminal, an output terminal and a selection input terminal;
a second buffer comprising an input terminal, an output terminal and a selection input terminal;
a third buffer comprising an input terminal, an output terminal and a selection input terminal; and
a fourth buffer comprising an input terminal, an output terminal and a selection input terminal;
wherein, the input terminal of the register is connected to the output terminals of the first buffer and the third buffer, the output terminal of the register is connected to the input terminals of the second buffer and the fourth buffer, the input terminal of the first buffer is connected to the output terminal of the fourth buffer and the second I/O terminal of the bi-direction register, the input terminal of the third buffer is connected to the output terminal of the second buffer and the first I/O terminal of the bi-direction register, and, the selection input terminals of the first, second, third and fourth buffers are connected to the selection input terminal of the generator.

7. The generator of claim 6, wherein the register comprises a D type flip-flop.

8. The generator of claim 5, wherein the first bi-function circuit comprises:
an XOR gate comprising an output terminal, a first input terminal and a second input terminal;
a first buffer comprising an input terminal, an output terminal and a selection input terminal;
a second buffer comprising an input terminal, an output terminal and a selection input terminal; and
a third buffer comprising an input terminal, an output terminal and a selection input terminal;
wherein, the output terminal of the XOR gate is connected to the input terminal of the second buffer, the first input terminal of the XOR gate is connected to the output terminal of the first buffer, the second input terminal of the XOR gate is the input terminal of the first bi-function circuit, the output terminal of the third buffer is connected to the input terminal of the first buffer and the first I/O terminal of the first bi-function circuit, the input terminal of the third buffer is connected to the output terminal of the second buffer and the second I/O terminal of the first bi-function circuit, and, the selection input terminals of the first, second and third buffers are connected to the selection input terminal of the generator.

9. The generator of claim 5, wherein the second bi-function circuit comprises:
an XOR gate comprising an output terminal, a first input terminal and a second input terminal;
a first buffer comprising an input terminal, an output terminal and a selection input terminal;
a second buffer comprising an input terminal, an output terminal and a selection input terminal; and
a third buffer comprising an input terminal, an output terminal and a selection input terminal;
wherein, the output terminal of the XOR gate is connected to the input terminal of the second buffer, the first input terminal of the XOR gate is connected to the output terminal of the first buffer, the second input terminal of the XOR gate is connected to the input terminal of the second bi-function circuit, the output terminal of the third buffer is connected to the input terminal of the first buffer and the second I/O terminal of the second bi-function circuit, the input terminal of the third buffer is connected to the output terminal of the second buffer and the first I/O terminal of the second bi-function circuit, and, the selection input terminals of the first, second and third buffers are connected to the selection input terminal of the generator.

10. The generator of claim 1, the first state corresponding to calculation of a first primitive characteristic polynomial, the second state corresponding to calculation of a second primitive characteristic polynomial, wherein the first primitive characteristic polynomial and the second primitive characteristic polynomial are complementary to each other.

11. The generator of claim 10, wherein the first primitive characteristic polynomial is $X^4+X^3+1$ and the second primitive characteristic polynomial is $X^4+X+1$.

12. A generator for generating pointer values pointing to a stack, comprising:
a selection input terminal for inputting a selection signal responsive to a command accessing the stack;
a bi-direction circuit for performing calculation of primitive characteristics polynomial in response to the selection signal, the bi-direction circuit selectively switching to a first state and a second state in response to the selection signal; and
a bi-direction number sequence generation circuit for selecting one of up-counting and down-counting orders during calculation to generate the pointer values in response to the selection signal and calculation one of the specific primitive characteristic polynomial.

13. The generator of claim 12, the bi-direction circuit comprising a bi-direction XOR gate, the bi-direction XOR gate comprising a first I/O terminal, a second I/O terminal, a data input terminal and a selection input terminal;
wherein when the bi-direction circuit is in the first state, the first I/O terminal executes input function and the second I/O terminal executes output function; and
wherein when the bi-direction circuit is in the second state, the first I/O terminal executes output function and the second I/O terminal executes input function.

14. The generator of claim 13, wherein the bi-direction XOR gate comprises:
an XOR gate comprising an output terminal, a first input terminal and a second input terminal;
a first buffer comprising an output terminal, an input terminal and a selection input terminal;

a second buffer comprising an output terminal, an input terminal and a selection input terminal;

a third buffer comprising an output terminal, an input terminal and a selection input terminal; and a fourth buffer comprising an output terminal, an input terminal and a selection input terminal;

wherein, the first input terminal of the XOR gate is connected to the output terminals of the second buffer and the fourth buffer, the second input terminal of the XOR gate is the data input terminal of the bi-direction XOR gate, the output terminal of the XOR gate is connected to the input terminals of the first buffer and the third buffer, the output terminal of the first buffer is connected to the input terminal of the fourth buffer and the second I/O terminal of the bi-direction XOR gate, the input terminal of the second buffer is connected to the output terminal of the third buffer and the first I/O terminal of the bi-direction XOR gate, the selection input terminals of the first, second, third and fourth buffers are together connected to the selection input terminal of the bi-direction XOR gate, and, the selection input terminal of the bi-direction XOR gate is connected to the selection input terminal of the generator.

15. The generator of claim 12, wherein the bi-direction number sequence generation circuit comprises:

N bi-direction registers connected together in series, each bi-direction register, comprising a first I/O terminal and a second I/O terminal, selectively switching to one of the first state and the second state to execute register function in response to the selection signal, N being a positive integer;

a NOR gate comprising an output terminal and (N–1) input terminals;

a first bi-function circuit, comprising a first I/O terminal, a second I/O terminal and an input terminal, selectively switching to one of the first state and the second state to execute XOR gate and buffer function in response to the selection, signal; and a second bi-function circuit, comprising a first I/O terminal, a second I/O terminal and an input terminal, selectively switching to one of the first state and the second state to execute buffer and XOR gate function in response to the selection signal;

wherein, the second I/O terminals of the (1st~N–1th) bi-direction registers are connected to the N–1 input terminals of the NOR gate, the output terminal of the NOR gate is connected to the input terminals of the first bi-function circuit and the second bi-function circuit, the first I/O terminal of the first bi-function circuit is connected to the first I/O terminal of the bi-direction XOR gate, the second I/O terminal of the first bi-function circuit is connected to the first I/O terminal of the first bi-direction register, the second I/O terminal of the Nth bi-direction register is connected to the first I/O terminal of the second bi-function circuit, the second I/O terminal of the second bi-function circuit is connected to the second I/O terminal of the bi-direction XOR gate, at least one of the second I/O terminals of the N bi-direction registers, responsive to the specific primitive characteristic polynomial, is connected to the data input terminal of the bi-direction XOR gate, and, the bi-direction number sequence generation circuit generates $2^N$ pointer values;

wherein when the bi-direction number sequence generation circuit is in the first state, the second I/O terminals of the N bi-direction registers, the second I/O terminal of the first bi-function circuit and the second I/O terminal of the second bi-function circuit respectively execute input function, and the first I/O terminals of the N bi-direction registers, the first I/O terminal of the first bi-function circuit and the first I/O terminal of the second bi-function circuit respectively execute output function;

wherein when the bi-direction number sequence generation circuit is in the second state, the first I/O terminals of the N bi-direction registers, the first I/O terminal of the first bi-function circuit and the first I/O terminal of the second bi-function circuit respectively execute input function, and the second I/O terminals of the N bi-direction registers, the second I/O terminal of the first bi-function circuit and the second I/O terminal of the second bi-function circuit respectively execute output function.

16. The generator of claim 12, the first state corresponds to the pointer values generated while selecting the up-counting order during calculation of a first primitive characteristic polynomial, the second state corresponds to the pointer values generated while selecting the down-counting order during calculation of a second primitive characteristic polynomial, the first primitive characteristic polynomial and the second primitive characteristic polynomial are complementary to each other.

17. The generator of claim 10, wherein the first primitive characteristic polynomial is $X^4+X^3+1$ and the second primitive characteristic polynomial is $X^4+X+1$.

18. A method for generating pointer values pointing to a stack, comprising the steps of:

(a) selecting one of a first state and a second state; and (b) generating the pointer values;

wherein, the first state corresponds to the pointer values generated while selecting an up-counting order during calculation of a first primitive characteristic polynomial, the second state corresponds to the pointer values generated while selecting a down-counting order during calculation of a second primitive characteristic polynomial, and, the first primitive characteristic polynomial and the second primitive characteristic polynomial are complementary to each other.

19. The method of claim 18, wherein the first primitive characteristic polynomial is $X^4+X^3+1$ and the second primitive characteristic polynomial is $X^4+X+1$.

20. The method of claim 18, wherein the step (a) further comprises:

(c) selecting the first state when a data is written into the stack and selecting the second state when a data is read from the stack.

* * * * *